United States Patent [19]

Miyahara et al.

[11] Patent Number: 4,672,372
[45] Date of Patent: Jun. 9, 1987

[54] SEMICONDUCTOR DEVICE HAVING MATCHED-TIMING DYNAMIC CIRCUIT AND STATIC CIRCUIT

[75] Inventors: Hatsuo Miyahara; Fumio Baba; Hirohiko Mochizuki, all of Kawasaki, Japan

[73] Assignee: Fujitsu Limited, Kawasaki, Japan

[21] Appl. No.: 675,628

[22] Filed: Nov. 28, 1984

[30] Foreign Application Priority Data

Nov. 29, 1983 [JP] Japan .................................. 58-223105

[51] Int. Cl.⁴ .............................................. H04L 7/00
[52] U.S. Cl. ............................ 340/825.2; 340/825.21; 307/480
[58] Field of Search ............ 307/464, 247 A, 480–482; 377/28, 43; 340/825.2, 825.21, 825.83, 825.91, 365 S

[56] References Cited

U.S. PATENT DOCUMENTS 3,319,078 5/1967 Dunnet et al. ............... 307/464 X
4,044,312 8/1977 D'Ortenzio ................... 307/464 X Primary Examiner—Ulysses Weldon
Attorney, Agent, or Firm—Staas & Halsey

[57] ABSTRACT

A semiconductor device having a dynamic circuit and a static circuit, wherein a clock signal, in synchronization with the operation of the static circuit, initiates the operation of the dynamic circuit. A delay circuit of a static type is provided to delay the clock signal and generate a delayed clock signal. The delayed clock signal initiates operation of one stage of the dynamic circuit. As a result, the final-operation timing of the dynamic circuit is substantially controlled by the delayed clock signal, thereby matching the operation of the dynamic circuit with the operation of the static circuit, regardless of the power supply voltage.

8 Claims, 15 Drawing Figures

Fig. I  PRIOR ART

SEMICONDUCTOR DEVICE HAVING MATCHED-TIMING DYNAMIC CIRCUIT AND STATIC CIRCUIT

BACKGROUND OF THE INVENTION

The present invention relates to a semiconductor device having a dynamic circuit and a static circuit and having means for matching the operation timing of the circuits.

Recently, semiconductor devices such as static metal oxide semiconductor (MOS) memory devices incorporate dynamic circuits for the reduction of power dissipation (See: F. Baba et al "A 35 ns Static Column DRAM", 1983 IEEE International Solid-state Circuits Conference, Digest of Technical Papers, Article No. WPM6.5, pp 64–65, Feb. 1983).

A static circuit uses mainly depletion-type load transistors, so the operation of the static circuit is carried out without clock signals. Contrary to this, a dynamic circuit is controlled by clock signals, that is, the active mode and reset mode of the dynamic circuit are controlled by clock signals.

In addition, the dependency of the operation of the two types of circuit differs. That is, in a dynamic circuit, the higher the operating speed, the higher the power supply voltage. Contrary to this, in a static circuit, the operating speed is increased only slightly even when the power supply voltage becomes high. Therefore, when the operation timing of the dynamic circuit is shifted due to the fluctuation of the power supply voltage, the operation of the dynamic circuit cannot be matched with that of the static circuit, so that the subsequent downstream circuit cannot be normally operated.

SUMMARY OF THE INVENTION

It is an object of the present invention to provide a semiconductor device incorporating a dynamic circuit and a static circuit in which the operation timing of the dynamic circuit is matched with the operation timing of the static circuit, thereby enabling normal operation of the device.

According to the present invention, a delay circuit is provided to delay a clock signal which initiates the operation of the dynamic circuit in synchronization with the operation of the static circuit. The delayed clock signal initiates the operation of one stage, such as the final stage, of the dynamic circuit. As a result, the final operation timing of the dynamic circuit is substantially determined by the delay clock signal. This timing is delayed an almost constant amount as compared with the operation timing of the static circuit, since the delay circuit is also formed by a static circuit. Thus, the operation of the dynamic circuit is matched with the operation of the static circuit.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

Figure 1:
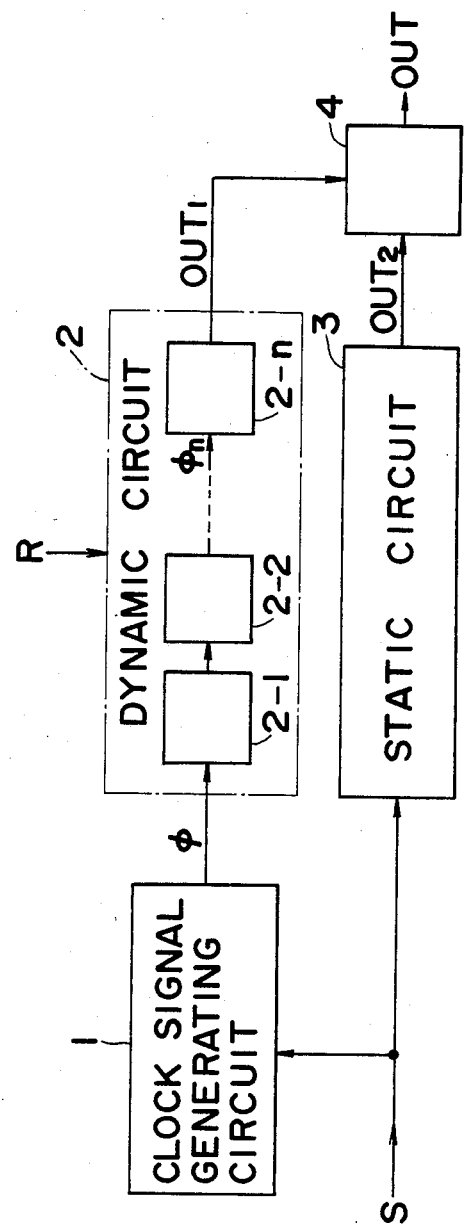
FIG. 1 is a block circuit diagram of a prior art semiconductor device.

In FIG. 1, which illustrates a prior art semiconductor device, reference numeral 1 designates a clock signal generating circuit for generating a clock signal $\phi$ by receiving an external signal S. In this case, when the clock signal generating circuit 1 detects a change of the potential of the signal S, this circuit 1 generates a rectangular clock signal $\phi$ and transmits the clock signal $\phi$ to a dynamic circuit 2 having a plurality of stages 2-1, 2-2, ..., and 2-n. Each of the stages 2-1, 2-2, ..., 2-n is reset or precharged by a reset signal R generated from the control circuit (not shown). In addition, after the potential of the reset signal R is caused to be low, the clock pulse $\phi$ initiates the operation of the stages 2-1, 2-2, ..., and 2-n sequentially. Note that each stage serves as an amplifier, however, each stage can receive or generate other control signals. The final stage 2-n of the dynamic circuit 2 generates an output signal OUT$_1$ and transmits it to an output circuit 4.

On the other hand, the signal S is transmitted directly to a static circuit 3. This generates an output signal OUT$_2$ in response to the signal S and transmits it to the output circuit 4.

In this case, only when the output signal OUT$_1$ of the dynamic circuit 2 matches the output signal OUT$_2$ of the static circuit 3 does the output circuit 4 generate an output signal OUT. For example, when the potential of the output signal OUT$_1$ becomes high after the potential of the output signal OUT$_2$ becomes high, the output circuit 4 generates an output signal OUT. Contrary to this, when the potential of output signal OUT$_2$ becomes high after the potential of the signal OUT$_1$ becomes high, the output circuit 4 does not generate an output signal OUT.

The final stage 2-n of the dynamic circuit 2, the static circuit 3, and the output circuit 4 will now be explained with reference to FIG. 2.

The final stage 2-n of the dynamic circuit 2 includes, in this case, N-channel MOS transistors Q$_{21}$ through Q$_{30}$ and a capacitor C$_1$. The following explanation also applies to the circuit wherein P-channel MOS transistors are used. Referring to FIG. 3, during a reset mode, when the potential of the reset signal R is high, the transistors Q$_{22}$, Q$_{23}$, Q$_{25}$, and Q$_{28}$ are turned on, so that the potentials at nodes $N_{21}$ and $N_{24}$ are low and the potentials at nodes $N_{22}$ and $N_{23}$ are high. Therefore, the potential of the output signal $OUT_1$ is low. Next the potential of the reset signal R falls from $V_{cc}$ to $V_{ss}$ and the potential of the signal $\phi_n$ generated from the pre-stage of the dynamic circuit 2 rises from $V_{ss}$ to $V_{cc}$, thereby changing the operation mode from the reset mode to an active mode. In this active mode, the transistor $Q_{21}$ is turned on to increase the potential at node $N_{21}$. As a result, the transistor $Q_{24}$ is turned on and the potential at node $N_{22}$ falls. In addition, since the potential at node $N_{23}$ rises to a potential higher than $V_{cc}$ due to the bootstrap effect at the transistor $Q_{27}$ in response to the rise of the signal $\phi_n$, the potential at node $N_{24}$ rises from $V_{ss}$ to $V_{cc}$. When the potential at node $N_{22}$ falls, the transistor $Q_{26}$ turns on and the potential at node $N_{23}$ falls from a potential higher than $V_{cc}$ to $V_{ss}$. When the potential at node $N_{24}$ becomes high, the transistor $Q_{29}$ turns on and the output signal $OUT_1$ becomes higher than $V_{ss}$. As a result, the potential at node $N_{24}$ becomes higher than $V_{cc}$ due to the bootstrap effect of the capacitor $C_1$, and accordingly, the output signal $OUT_1$ reaches $V_{cc}$. Thus, the final stage 2-n of FIG. 2 serves as a dynamic buffer circuit for generating an output signal $OUT_1$ in accordance with the fall of the reset signal R from $V_{cc}$ to $V_{ss}$ and the rise of the input signal $\phi_n$ from $V_{ss}$ to $V_{cc}$.

Returning to FIG. 2, the static circuit 3 includes an inverter formed by a depletion-type transistor $Q_{31}$ and an enhancement-type transistor $Q_{32}$. The output circuit 4 includes enhancement-type transistors $Q_{41}$ and $Q_{42}$ and a capacitor $C_2$.

Figure 2:
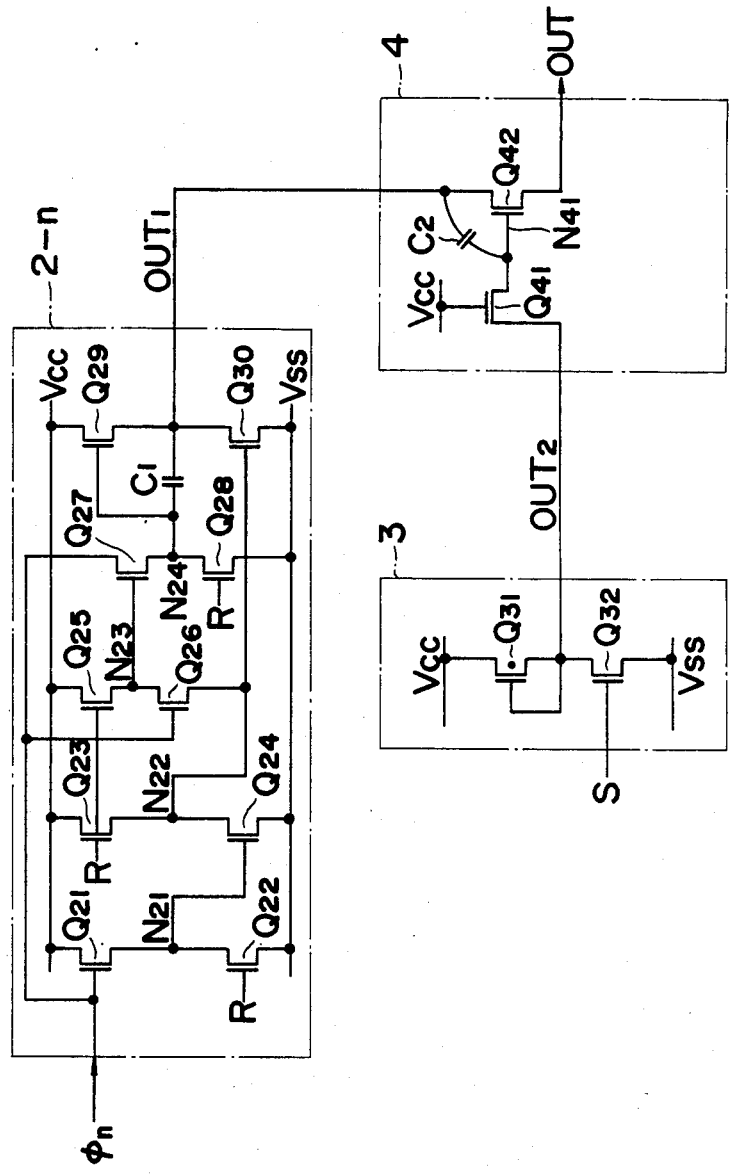
FIG. 2 is a circuit diagram of one stage of the dynamic circuit, the static circuit, and the output circuit of FIG. 1.
Figure 3:
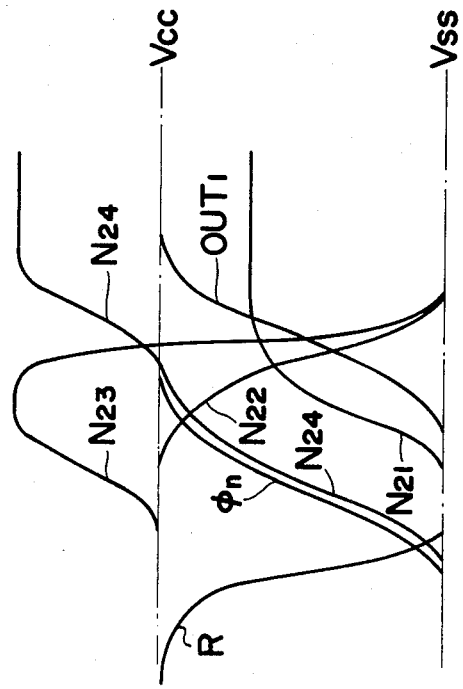
FIGS. 3, 4A, and 4B are timing diagrams for explaining the operation of the circuit of FIG. 2.
Figure 4A:
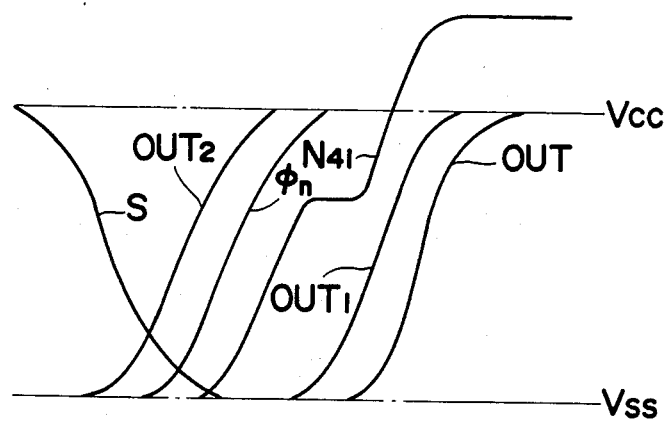

In the circuit of FIG. 2, as illustrated in FIG. 4A, when the signal S falls from $V_{cc}$ to $V_{ss}$, the potential of the output signal $OUT_2$ rises from $V_{ss}$ to $V_{cc}$. On the other hand, as explained above for the dynamic buffer stage 2-n, the signal $\phi_n$ rises from $V_{ss}$ to $V_{cc}$. At this time, when the potential at node $N_{41}$ rises to a potential lower than $V_{cc}$ by the threshold voltage $V_{th}$ of the transistor $Q_{41}$, this transistor $Q_{41}$ cuts off, thereby stopping the rise of the potential at node $N_{41}$. After that, when the potential of the output signal $OUT_1$ of the dynamic buffer stage 2-n rises, the potential at node $N_{41}$ is raised further by the capacitor $C_2$ and the potential of the output signal is raised from $V_{ss}$ to $V_{cc}$ by the transistor $Q_{42}$.

Figure 4B:
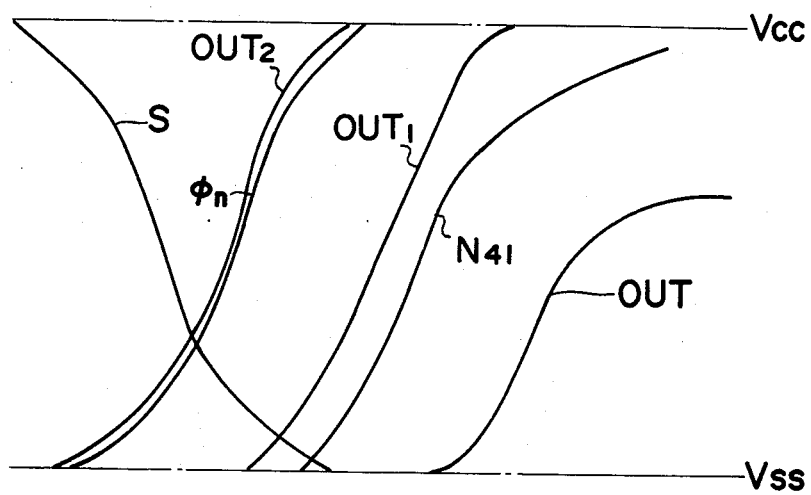

However, when the power supply voltage $V_{cc}$ rises, the dynamic circuit 2 operates quickly. That is, as illustrated in FIG. 4B, the potential of the signal $\phi_n$ quickly rises due to the fast operation of the pre-stages 2-1, 2-2, . . . of the dynamic circuit 2. As a result, before the potential at node $N_{41}$ becomes sufficiently high and cuts off the transistor $Q_{42}$, the potential of the signal $OUT_1$ of the dynamic buffer stage 2-n rises. As a result, the charges at node $N_{41}$ are partially discharged through the transistor $Q_{41}$. Therefore, the voltage at node $N_{41}$ cannot rise to a sufficiently high potential. As a result, the output OUT cannot rise to $V_{cc}$.

Thus, in a prior art device wherein a dynamic circuit and a static circuit are mixed, the operation timings of both types of circuits are shifted by the fluctuation of the power supply voltage $V_{cc}$. Accordingly, there is a disadvantage in that the circuit operation cannot be normally carried out.

Figure 5:
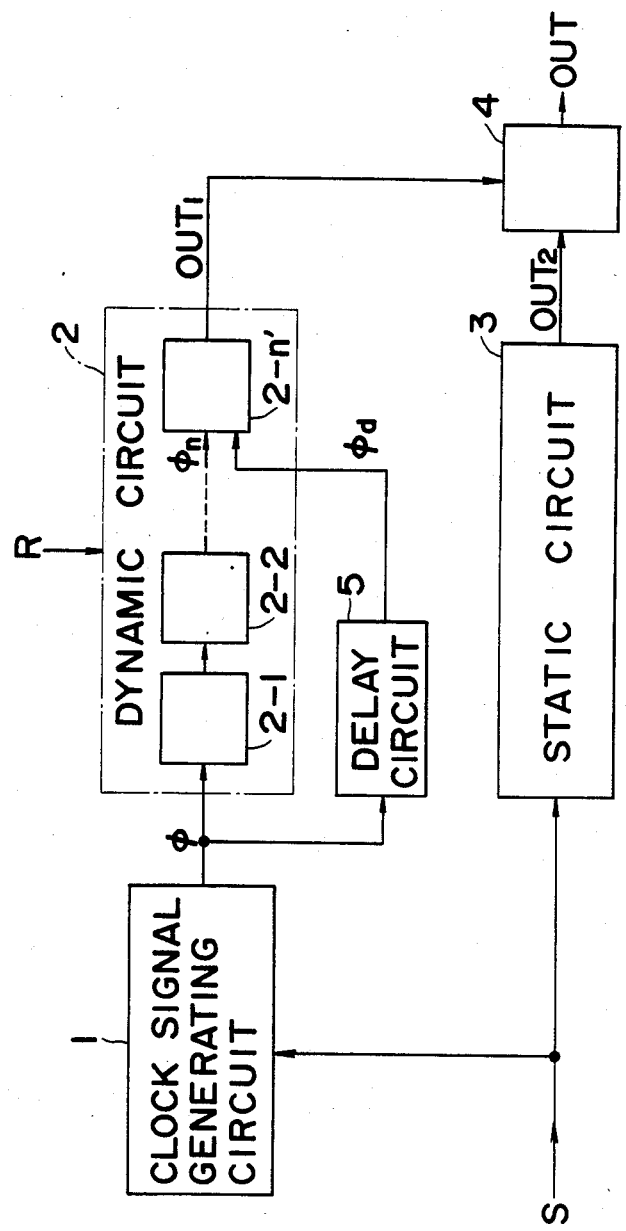
FIG. 5 is a block circuit diagram of an embodiment of the semiconductor device according to the present invention.

In FIG. 5, which illustrates an embodiment of the present invention, a delay circuit 5 of a static type is added to the elements of FIG. 5. The delay circuit 5 is linked between the clock signal generating circuit 1 and the final stage 2-n' of the dynamic circuit 2.

Figure 6:
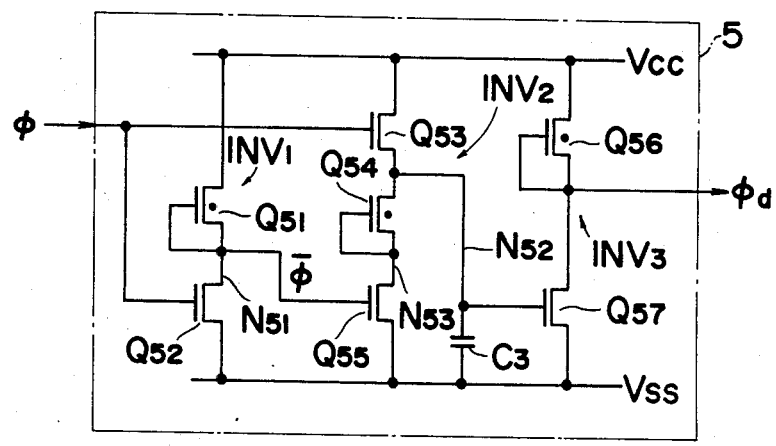
FIG. 6 is a circuit diagram of the delay circuit of FIG. 5.

Referring to FIG. 6, the delay circuit 5 includes an inverter $INV_1$ formed by: a depletion-type transistor $Q_{51}$ and an enhancement-type transistor $Q_{52}$; an inverter $INV_2$ formed by enhancement-type transistors $Q_{53}$, and $Q_{55}$ and a depletion-type transistor $Q_{54}$; a capacitor $C_3$; and an inverter $INV_3$ formed by an enhancement-type transistor $Q_{56}$ and an enhancement-type transistor $Q_{57}$. Therefore, the potential $\overline{\phi}$ at node $N_{51}$ is obtained by inverting the clock signal $\phi$. The inverter $INV_2$ is controlled by the signals $\phi$ and $\overline{\phi}$, which are opposite in phase. When the potential of the clock signal $\phi$ is high, the inverter $INV_2$ charges the capacitor $C_3$, so as to turn on the transistor $Q_{57}$ of the inverter $INV_3$. Contrary to this, when the potential of the clock signal $\phi$ is high, the inverter $INV_2$ discharges the capacitor $C_3$, so as to cut off the transistor $Q_{57}$ of the inverter $INV_3$. Thus, the delay circuit 5 inverts and delays the clock signal $\phi$ and generates a delayed clock signal $\phi_d$. The delay amount of this circuit 5 is determined by the depletion-type transistor $Q_{54}$ and has characteristics similar to those of the load depletion-type transistor $Q_{31}$ of the static circuit 3 which affects the operation delay time of the static circuit 3. The transistor $Q'_{21}$ is linked between the source of the transistor $Q_{21}$ and the drain of the transistor $Q_{22}$, and the delayed clock signal $\phi_d$ generated in the delay circuit 6 is applied to the gate of the transistor $Q_{21}$.

Figure 7:
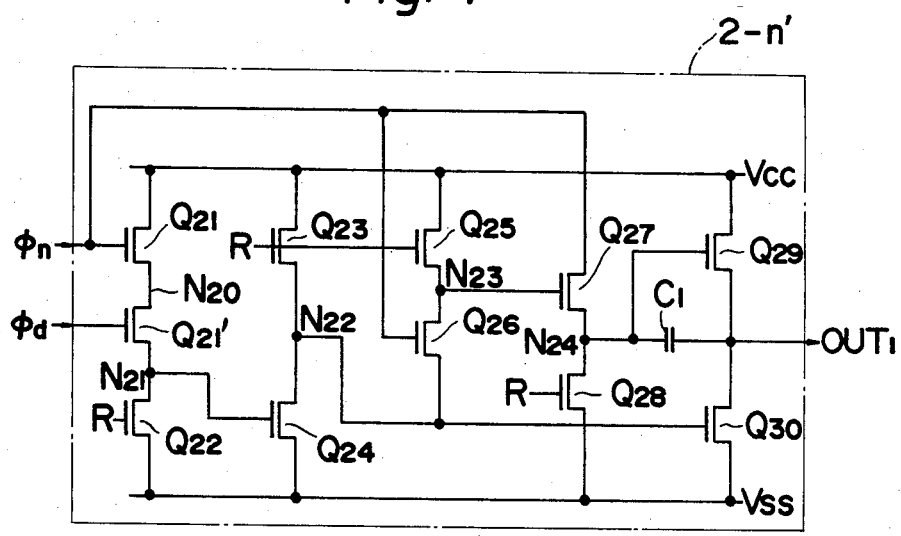
FIG. 7 is a circuit diagram of the final stage of the dynamic circuit of FIG. 5.

In FIG. 7, which is a detailed circuit diagram of the final stage 2-n' of the dynanic circuit 2 of FIG. 5, an enhancement-type transistor $Q'_{21}$ is added to the elements of the final stage 2-n of FIG. 2. In FIG. 7, even when the potential of the signal $\phi_n$ is caused to be high after the potential of the reset R becomes low, the final stage 2-n' does not begin to operate until the potential of the delayed clock signal $\phi_d$ is caused to be high. Therefore, the final stage 2-n', i.e., the dynamic circuit 2, operates in response to the operation of the static circuit 3.

Figure 8:
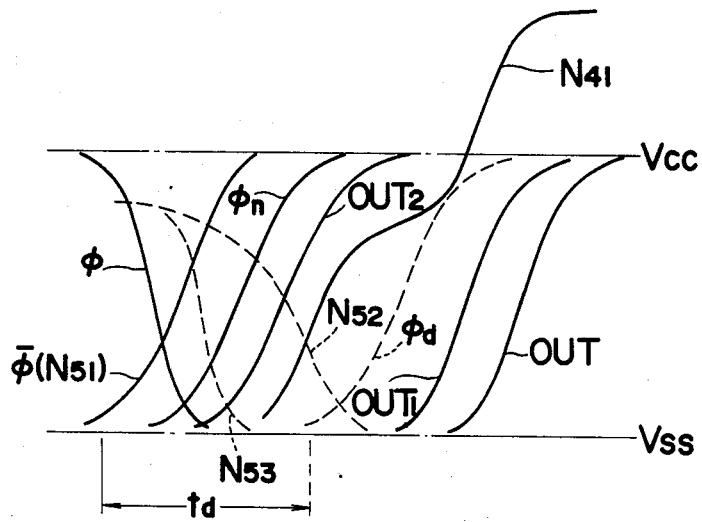
FIG. 8 is a timing diagram for explaining the operation of the circuit of FIG. 6.

Referring to FIG. 8, the operation of the delay circuit of FIG. 6 will be explained. When the clock signal $\phi$ falls from $V_{cc}$ to $V_{ss}$ and accordingly, the clock signal $\overline{\phi}$ rises from $V_{ss}$ to $V_{cc}$, the transistor $Q_{53}$ cuts off and the transistor $Q_{55}$ turns on. Therefore, the potential at node $N_{53}$ falls rapidly to $V_{ss}$. However, the potential at node $N_{52}$ slowly falls in accordance with a time constant determined by the characteristics of the depletion-type transistor $Q_{54}$ and the capacitor $C_3$. Also, when the potential at node $N_{52}$ becomes lower than the threshold voltage $V_{th}$ of the transistor $Q_{57}$, this transistor cuts off to raise the potential of the clock signal $\phi_d$ from $V_{ss}$ to $V_{cc}$. As a result, the clock signal $\phi_d$ is delayed with a predetermined delay time period $t_d$ from the time point of the fall of the potential of the clock signal $\phi$.

Thus, the delayed clock signal $\phi_d$ is applied to the transistor $Q'_{21}$, i.e., the final stage 2-n' of the dynamic circuit 2 of FIG. 7, and in FIG. 7, the reset signal R falls and the signal $\phi_n$ rises. Then, after a predetermined delay time period has passed, the output signal $OUT_1$ is generated. Therefore, in the device of FIG. 5, since the dynamic circuit 2 cannot operate too quickly, and the potential at node $N_{41}$ (FIG. 2) can rise to a sufficiently high level, the output OUT can completely reach $V_{cc}$.

Figure 9:
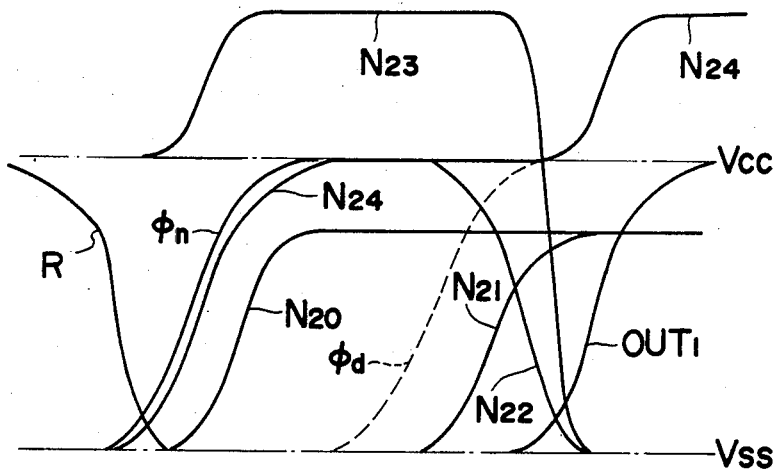
FIG. 9 is a timing diagram for explaining the operation of the circuit of FIG. 5.

The operation of the device of FIG. 5 including FIGS. 6 and 7 will be explained with reference to FIG. 9. After a predetermined reset time period, the reset signal R falls from a voltage higher than $V_{cc}$ to $V_{ss}$, and the signal $\phi_n$ rises from $V_{ss}$ to $V_{cc}$. As a result, the transistor $Q_{21}$ (FIG. 7) turns on and the potential at node $N_{20}$ rises from $V_{ss}$ to a potential lower than $V_{cc}$ by the threshold voltage $V_{th}$ of the transistor $Q_{21}$. By this time, the potential at node $N_{23}$ has been precharged to the power supply voltage $V_{cc}$ by the on-state transistor $Q_{25}$. However, when the signal $\phi_n$ rises from $V_{ss}$ to $V_{cc}$, the potential at node $N_{23}$ is further raised to a high potential by the gate-capacitance of the transistor $Q_{27}$. In addition, the potential at node $N_{24}$ rises from $V_{ss}$ to $V_{cc}$, since the gate potential of the transistor $Q_{27}$, i.e., the potential at node $N_{23}$, is raised. Further, when the delayed clock signal $\phi_d$ rises from $V_{ss}$ to a potential higher than the threshold voltage $V_{th}$ of the transistor $Q_{21}$, the transistor $Q_{21}$ turns on to increase the potential at node $N_{21}$ from $V_{ss}$ to a high potential. Therefore, the transistor $Q_{24}$ is turned on, and the potential at node $N_{22}$ falls from $V_{cc}$ to $V_{ss}$. Also since the transistor $Q_{26}$ turns on, the potential at node $N_{23}$ falls to $V_{ss}$, thereby cutting off the transistor $Q_{30}$. As a result, the potential of the output signal $OUT_1$ rises from $V_{ss}$ to $V_{cc}$. Thus, in the circuit of FIG. 7, the delayed output signal $OUT_1$ is generated in accordance with the rise of the delayed clock signal $\phi_d$.

Figure 10:
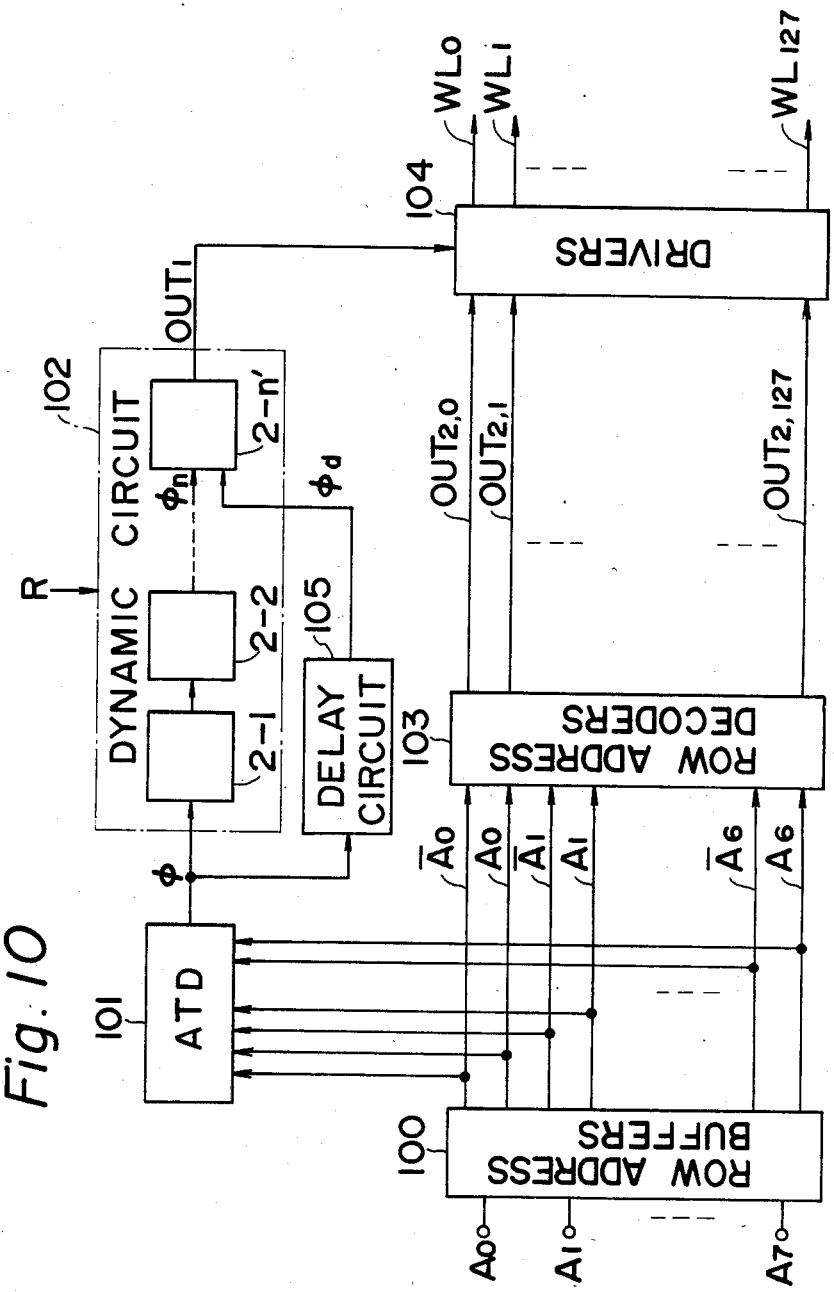
FIG. 10 is a block circuit diagram of another embodiment of the semiconductor device according to the present invention.

In FIG. 10, which illustrates another embodiment of the present invention, a row selection portion of a 16 kbit static MOS random access memory (RAM) is illustrated. In FIG. 10, reference numeral 100 designates row address buffers which receive external row address signals $\overline{A_0}, \overline{A_1}, \ldots,$ and $\overline{A_7}$ of a transistor-transistor logic (TTL) level and generate internal address signals $\overline{A_0}, \overline{A_1}, \ldots,$ and $\overline{A_7}$ of a MOS level and their inverted signals $A_0, A_1, \ldots, A_7$. The internal row address signals $A_0 A_1, \ldots,$ and $A_7$ are transmitted to an address transition detection circuit 101, which corresponds to the clock signal generating circuit 1 of FIG. 5. When the address transition detection circuit 101 detects a transition of the internal row address signals $A_0, A_1, \ldots,$ and $A_7$ and their inverted signals $\overline{A_0}, \overline{A_1}, \ldots,$ and $\overline{A_7}$, the circuit 101 also generates a clock signal $\phi$ and transmits it to a dynamic circuit 102 and a delay circuit 105, which have the same configuration as the dynamic circuit 5 and the delay circuit 2, respectively, of FIG. 5.

In addition, the internal row address signals $A_0, A_1, \ldots,$ and $A_7$ and their inverted signals $\overline{A_0}, \overline{A_1}, \ldots,$ and $\overline{A_7}$ are transmitted to row address decoders 103 of a static type, which correspond to the static circuit 3 of FIG. 5. The row address decoders 103 decode the above-mentioned internal address signals and generate one of the output signals $OUT_{2,0}, OUT_{2,1}, \ldots, OUT_{2,127}$.

Reference numeral 104 designates drivers which correspond to the output circuit 4 of FIG. 5. In these drivers 104, it is necessary to match the timing of the output signals $OUT_1$ with the timing of one selected output signal, such as $OUT_{2,0}$, of the row address decoders 103. For this purpose, the delay circuit 105 is provided in the same way as in FIG. 5.

The address transition circuit 101 will be explained with reference to FIGS. 11A, 11B, and 11C.

Figure 11A:
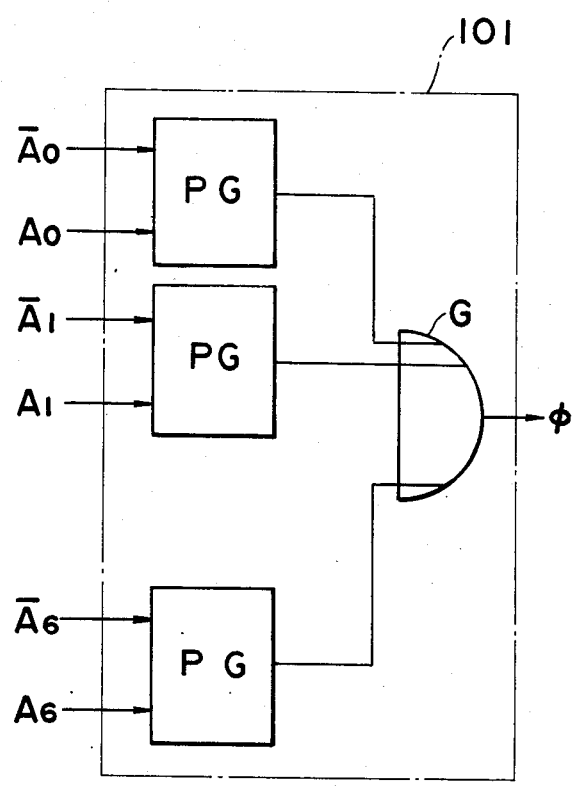
FIG. 11A is a logic circuit diagram of the address transition detection circuit of FIG. 10.

In FIG. 11A, which illustrates the address transition circuit 101, the address transition circuit 101 includes a plurality of pulse generating circuits PG, corresponding to each of the internal address signals $\overline{A_0}, A_0, \overline{A_1}, A_1, \ldots, \overline{A_7},$ and $A_7$, and an OR gate G. The pulse generating circuits PG detect a change of the address signal and generate a pulse having a predetermined time period. For example, as illustrated in FIG. 11B, the pulse generating circuit PG includes NAND gates $G_2$ through $G_4$, NOR gates $G_5$ and $G_6$, an OR gate $G_7$, and capacitors $C_{11}$ and $C_{12}$. In this case, the gates $G_2$, and $G_5$ and the capacitor $C_{11}$ form a rise-detecting circuit, and the gates $G_3$, $G_4$, and $G_6$ and the capacitor $C_{12}$ form a fall-detecting circuit. Therefore, the output of the gate $G_7$ detects the rise and fall of the address signal $A_i$, i.e., the change thereof, and generates the clock signal $\phi$. In more detail, referring to FIG. 11C, when the address signal $A_i$ (node a) is changed from "1" to "0", the output b is changed from "0" to "1". Since the output d of the NAND gate $G_2$ is an inverted signal of the signal b, which is delayed a little by the capacitor $C_{11}$, the output f of the NOR gate $G_5$ is a pulse which is generated by the rise of the address signal $A_i$. Similarly, the output g of the NOR gate $G_6$ is a signal which is generated by the fall of the address signal $A_i$. Therefore, the output h of the OR gate $G_7$, which combines the signal f with the signal g, is a clock signal which is generated by the fall of the address signal $A_i$.

Figure 11B:
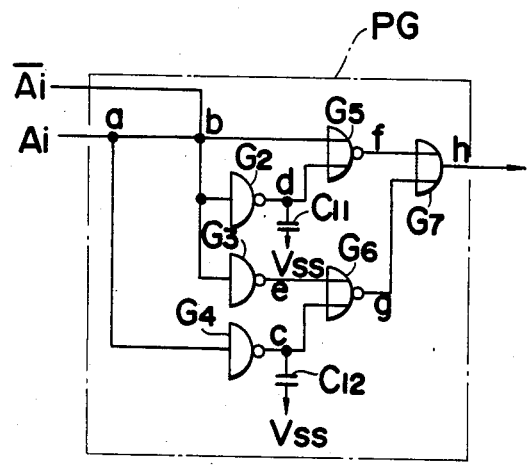
FIG. 11B is a logic circuit diagram of the pulse generating circuit of FIG. 11A.
Figure 11C:
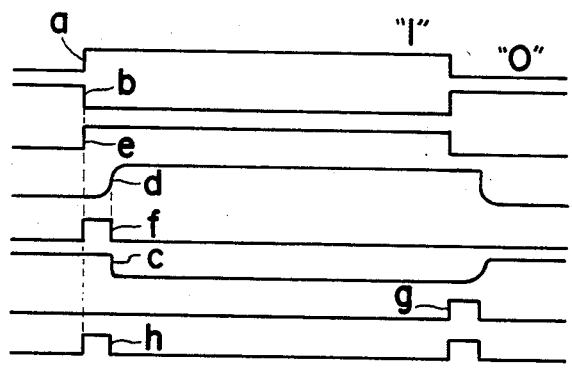
FIG. 11C is a timing diagram for explaining the operation of the circuit of FIG. 11B.

In FIG. 11A, such a pulse generating circuit PG as illustrated in FIG. 11B is provided for each internal address signal pair, and accordingly, the clock pulse generating circuit 101 generates a clock signal $\phi$ when any one of the internal address signals is changed.

Figure 12:
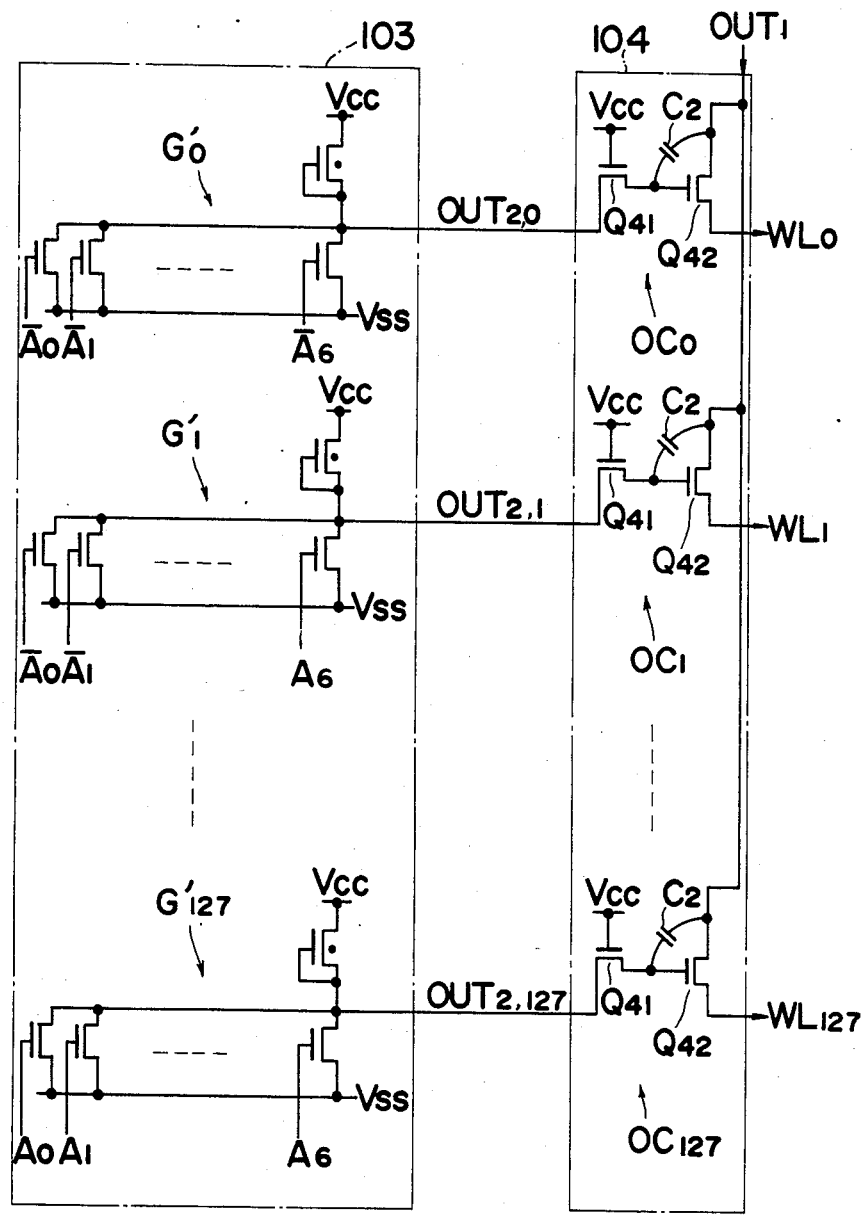
FIG. 12 is a circuit diagram of the address decoders and the drivers of FIG. 10.

Referring to FIG. 12, the address decoders 103 includes 64 NOR gates $G'_0, G'_1, \ldots,$ and $G'_{127}$, each of which receives the internal address signals $A_0$ (or $\overline{A_0}$), $A_1$ (or $\overline{A_1}$), $\ldots,$ and $A_7$ (or $\overline{A_7}$). That is, the address decoders 103 are of a static type. In addition, the drivers 104 include 64 output circuits $OC_0, OC_1, \ldots,$ and $OC_{127}$, each of which is the same as the output circuit 4 of FIG. 2.

The device of FIG. 10 operates in the same way as the device of FIG. 5. That is, even when the power supply voltage $V_{cc}$ is increased, the drivers 104 securely drive one of the word lines $WL_0, WL_1, \ldots,$ and $WL_{127}$, since the operation of the dynamic circuit 102 is matched with the operation of the row address decoders 103 by the delay circuit 105.

In the above-mentioned embodiments, the delay circuit is preferably connected to the final stage of the dynamic circuit, however, it is possible to connect the delay circuit to an intermediate stage of the dynamic circuit. In addition, the present invention can be applied to a column selection portion of the static RAM in which a dynamic circuit and a static circuit are mixed.

As explained hereinbefore, according to the present invention, since the operation timing of the dynamic circuit is controlled by a delay clock signal even when the operating speed of the dynamic circuit is increased due to the rise of power supply voltage or the like, it is possible to match the operation timing of the dynamic circuit with that of the static circuit by adjusting the delay amount of the delayed clock signal, and accordingly, it is possible to avoid the malfunction of a semiconductor device wherein a dynamic circuit and a static circuit are mixed.

We claim:

1. A semiconductor device comprising:
   clock signal generating circuit means for generating a clock signal in response to receiving an external signal;
   multi-stage dynamic circuit means, connected to said clock signal generating circuit means and being responsive to said clock signal, for providing a respective output as a result of a signal corresponding to said clock signal successively passing through each of the stages;

a delay circuit means of a static type, connected to said block signal generating circuit means and to one stage of said multi-stage dynamic circuit means, for delaying said clock signal and for generating a delayed clock signal, said one stage of said multi-stage dynamic circuit means being enabled by said delayed clock signal;

a static circuit means of a static type controlled by said external signal for provided a respective output; and an output circuit means, connected to said multi-stage dynamic circuit means and to said static circuit means, for generating an output signal in response to receiving said output of said static circuit means followed by said output of said multi-stage dynamic circuit means.

2. A device as set forth in claim 1, wherein said multi-stage dynamic circuit means includes a final stage and said delay circuit means is connected to the final stage of said multi-stage dynamic circuit means.

3. A device as set forth in claim 1, wherein said delay circuit means comprises:

a first inverter connected to said clock signal generating circuit means;

a second inverter connected to said clock signal generating circuit means and to said first inverter, said second inverter havng a load means;

a capacitor connected to said second inverter so that said capacitor is charged by said second inverter when the potential of said clock signal is at a first level, and said capacitor is discharged by said second inverter through said load means when the potential of said clock signal is at a second level; and a third inverter connected to said capacitor, for generating said delayed clock signal.

4. A semiconductor device comprising:

address buffer means for receiving external address signals and for generating respective internal address signals and corresponding inverted internal address signals;

address transition detection circuit means, connected to said address buffer means, for outputting a clock signal when a transition in potential of said internal address signals is detected;

multi-stage dynamic circuit means, connected to said address transition detection circuit means, for providing a respective output thereof as a result of a signal corresponding to said clock signal successively passing through the stages thereof;

delay circuit means, connected to said address transition detection circuit means and to one stage of said multi-stage dynamic circuit means, for delaying said clock signal and for generating a delayed clock signal, said one stage of said multi-stage dynamic circuit being enabled by said delayed clock signal;

address decoder means, connected to said address buffer means, for decoding said internal address and inverted internal address signals and for providing a respective output; and drive circuit means, connected to said multi-stage dynamic circuit means and to said address decoder means, for generating a respective output signal in response to receiving said output of said address decoder means followed by said output of said multi-stage dynamic circuit means.

5. A device as set forth in claim 4, wherein said multi-stage dynamic circuit means includes a final stage and said delay circuit means is connected to the final stage of said multi-stage dynamic circuit means.

6. A device as set forth in claim 4, wherein said delay circuit means comprises:

a first inverter connected to said address transition detection circuit means;

a second inverter, connected to said address transition detection circuit means and to said first inverter, said second inverter having a load means;

a capacitor connected to said second inverter so that said capacitor is charged by said second inverter when the potential of said clock signal is at a first level, and said capacitor is discharged by second inverter through said load means when the potential of said clock signal is at a second level; and a third inverter connected to said capacitor, for generating said delayed clock signal.

7. The device of claim 4, said address transition detection circuit means comprises a plurality of pulse generators, each providing an output to an OR circuit the output of which is said clock signal, wherein the inputs of each of said pulse generators is a respective pair of said internal address signals inverted internal address signals.

8. The device of claim 7, each of said pulse generators includes three NAND gates connected to receive respective ones of said internal address and inverted internal address signals, two NOR gates connected to receive respective ones of said internal address signal and the outputs of said NAND gates, and an OR gate connected to receive the outputs of said NOR gates.

* * * * *

UNITED STATES PATENT AND TRADEMARK OFFICE
CERTIFICATE OF CORRECTION

PATENT NO. : 4,672,372

DATED : June 9, 1987

INVENTOR(S) : MIYAHARA ET AL.

It is certified that error appears in the above-identified patent and that said Letters Patent is hereby corrected as shown below:

Column 4, line 16, "$\phi$" should be --$\bar{\phi}$--.

Column 5, line 28, "$\bar{A}_0, \bar{A}_1, \ldots,$ and $\bar{A}_7$" should be --$A_0, A_1, \ldots,$ and $A_7$--;

line 30, "$\bar{A}_0, \bar{A}_1, \ldots,$ and $\bar{A}_7$" should be --$A_0, A_1, \ldots,$ and $A_7$--;

line 31, $A_0, A_1, \ldots,$ and $A_7$" should be --$\bar{A}_0, \bar{A}_1, \ldots,$ and $\bar{A}_7$--;

line 32, $A_0, A_1, \ldots,$ and $A_7$" should be --$\bar{A}_0, \bar{A}_1, \ldots,$ and $\bar{A}_7$--.

Column 8, line 45, "respcctive" should be --respective--.

Signed and Sealed this

Twenty-second Day of December, 1987

Attest:

DONALD J. QUIGG

*Attesting Officer*   *Commissioner of Patents and Trademarks*